United States Patent [19]

Arnold et al.

[11] Patent Number: 4,835,593

[45] Date of Patent: May. 30, 1989

[54] MULTILAYER THIN FILM METALLURGY FOR PIN BRAZING

[75] Inventors: Anthony F. Arnold, Poughkeepsie; Joseph A. Corso, Stormville; Shukla Kapur, Fishkill, all of N.Y.; Walter F. Lange, Longmont, Colo.; Da-Yuan Shih, Poughkeepsie, N.Y.

[73] Assignee: International Business Machines Corporation, Armonk, N.Y.

[21] Appl. No.: 860,408

[22] Filed: May 7, 1986

[51] Int. Cl.[4] .............................................. H01L 23/48
[52] U.S. Cl. ....................................... 357/71; 357/74; 357/80
[58] Field of Search .................... 361/402; 204/15; 357/71, 80, 67, 74; 174/52 FP

[56] References Cited

U.S. PATENT DOCUMENTS

| | | | |
|---|---|---|---|
| 3,576,722 | 4/1971 | Fennimore et al. | 204/15 |
| 4,074,342 | 2/1978 | Honn et al. | 357/68 X |
| 4,109,297 | 8/1978 | Lesh et al. | 361/402 |

FOREIGN PATENT DOCUMENTS 210873 9/1971 Fed. Rep. of Germany .

Primary Examiner—Thomas H. Tarcza
Assistant Examiner—John B. Sotomayor
Attorney, Agent, or Firm—Jesse L. Abzug; Joseph C. Redmond, Jr.

[57] ABSTRACT

A multilayered thin film structure for attaching input-/output pins to a ceramic substrate, and method of making the thin film structure are disclosed. A thin adhesion layer, which can suitably be a refractory metal such as titanium, vanadium, chromium or tantalum, is first formed on the surface of the substrate. A thick stress reducing layer of soft metal such as copper, silver, nickel, aluminum, gold or iron is subsequently formed over the adhesion layer. To prevent the soft metal from reacting with subsequently brazed gold-tin pin eutectic alloy, a reaction barrier layer which can be titanium or zirconium is then deposited over the soft stress reducing metal cushion layer. The process is completed by finally depositing a gold layer over the reaction barrier layer.

7 Claims, 1 Drawing Sheet

MULTILAYER THIN FILM METALLURGY FOR PIN BRAZING

BACKGROUND OF THE INVENTION

1. Field of Invention

This invention relates to a multilayer thin film metallic structure to be formed on a substrate for subsequent joining of connector pins. More particularly, a 4-layer structure including a relatively thick stress reducing cushion layer and titanium barrier layer is disclosed.

2. Background Information

The multilayer ceramic technology for integral mounting of semiconductor chips is well-known in the art. In semiconductor chip packaging, it is known to provide a ceramic substrate with termination pads on both the top and bottom surfaces of the substrate for attaching semiconductor chips, engineering change (EC) wires, input/output (I/O) connector pins, capacitors, etc. The assembled chip packages are then connected to the next level of packaging by means of the attached I/O pins on the bottom surface of the substrate.

The termination pads can be fabricated in a conventional manner by metal paste screening which upon sintering will become sintered dense metal pads suitable for the various interconnection purposes. Although this method of making termination pads has received wide acceptance in the alumina ceramic substrate technology, it nevertheless suffers from the disadvantage of requiring extreme care and attention when more fragile substrate materials such as glass ceramic are used.

Glass ceramics are known to have low dielectric constants and thermal coefficients of expansion (TCE) similar to silicon. For these reasons, it is desirable to use glass ceramics as a substitute for alumina ceramics in semiconductor chip packaging. Despite the desirability of employing glass ceramic in packaging technology, there is the problem of glass cracking due to the inherent fragile nature of the glass ceramic material. The thermal stresses experienced in the glass are principally due to the TCE mismatch between the I/O pad/pin joint and the glass ceramic substrate. It is further understood that the tensile stresses created along the radial direction in the immediate neighborhood of the I/O pad perimeters are critically dependent upon the following key factors: the size, thickness and geometry of the I/O pads; the material properties of the I/O pads; the pin joint morphology; and the distribution of braze alloy on the I/O pads.

It is therefore desirable to have a multilayer thin film structure which can be tailored to minimize the internal stresses generated by the pin braze operation within the ceramic, yet also provide for adequate adhesion to the ceramic substrate.

OBJECTS OF THE INVENTION

Therefore, it is the object of this invention to provide a multilayer thin film metallurgy for joining I/O interconnections to a substrate.

It is another object of this invention to provide a thin film I/O pad which includes a stress reducing cushion layer of soft metals which absorb the thermal as well as mechanical stresses from a brazed joint, thus significantly reducing the potential for cracking of a substrate.

SUMMARY OF THE INVENTION

In accordance with these objects, a multilayered thin film structure for attaching input/output pins to a ceramic substrate, and method of making the thin film structure are disclosed. A thin adhesion layer, which can suitably be a refractory metal such as titanium, vanadium, chromium or tantalum, is first formed on the surface of the substrate. A thick stress reducing layer of soft metal such as copper, silver, nickel, aluminum, gold or iron is subsequently formed over the adhesion layer. To prevent the soft metal from reacting with subsequently brazed gold-tin pin eutectic alloy, a reaction barrier layer which can be titanium or zirconium is then deposited over the soft stress reducing metal cushion layer. The process is completed by finally depositing a gold layer over the reaction barrier layer. An additional layer of nickel or palladium may also be included between the titanium and gold layers for improved wettability, or a combined reaction barrier layer/Au layer phased region may be deposited to facilitate multiple reflow or repair cycles.

BRIEF DESCRIPTION OF THE DRAWINGS

The foregoing and other advantages of the invention will be more fully understood with reference to the description of the preferred embodiment and with reference to the drawings wherein.

DESCRIPTION OF THE PREFERRED EMBODIMENT

Figure 1:
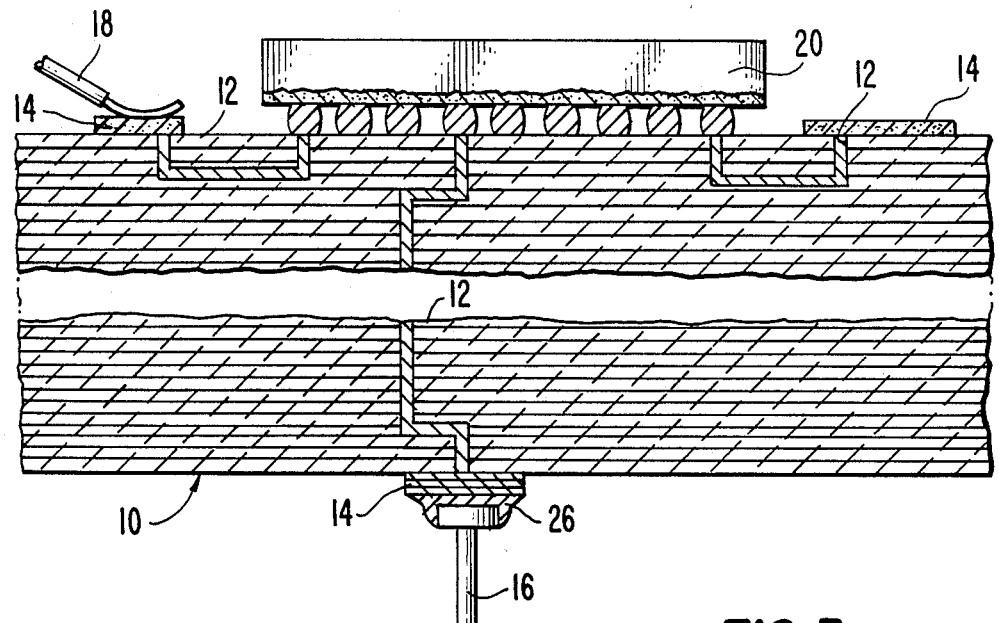
FIG. 1 is a cross-sectional view of a multilayer ceramic substrate.

Referring to FIG. 1, the structural details of a preformed multilayer ceramic substrate 10 are illustrated. Ceramic substrate 10 includes a network of conductive vias 12 which terminate in input/output pads 14. Pads 14 can be used to provide connections for pins 16, engineering change wires 18, or other types of I/O connections. Semiconductor chip 20 also is connected to the top of the ceramic substrate 10.

Figure 2:
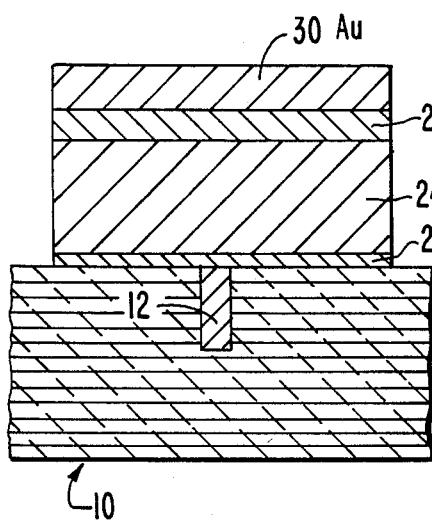
FIG. 2 is a cross-sectional view of a 4-layer thin film structure in accordance with the present invention.

Referring to FIG. 2, the sequence of metallizing the I/O pad pattern begins with the alignment and attachment of a mask (not shown) to the ceramic substrate 10. The mask contains an image of the multilayer pad pattern to be deposited. The type of mask used, metal, plastic, polymer, photoresist, etc. is not critical to this invention and can be any type commonly used in the art. Furthermore, the metallization pattern can be deposited in the desired pattern, or blanket layers of metal can be deposited over the entire substrate and then etched to form the desired pattern.

In the preferred embodiment, the formation of the multilayer thin film pads begins with the deposition of a thin layer of titanium 22 on the ceramic substrate 10. While titanium is the preferred adhesion layer, chromium, vanadium or tantalum can be used alternatively. The titanium layer 22 can be deposited by electron gun evaporation, sputtering, ion plating or other methods known in the art. The thickness of the adhesion layer 22 is preferably within the range 100 to 5000 angstroms.

To promote the adhesion bonding between layer 22 and the substrate 10, the substrate temperature is maintained between 90° C. and 350° C. during evaporation.

A soft metal cushion layer 24 is next deposited over adhesion layer 22. Layer 24 serves primarily as a stress reducing cushion which absorbs and reduces the stresses transmitted from the pin joint 26 (FIG. 1) to the ceramic substrate 10, thus significantly reducing the ceramic cracking concerns. This observation is consistent with basic thin film theory which states that when a stress is applied to one side of a metal film, gradients of plastic strains (or stresses) will set up over distances determined by both the yield strength and the thickness of the film.

Typically, copper is used as the stress cushion material with the preferred thickness of approximately 60,000 angstroms. However, thicknesses in the range 10,000–200,000 angstroms (1–20 microns) also demonstrated enhanced pin pull strength with reduced incidence of ceramic cracking. Other possible candidates for the soft metal cushion layer 24 include aluminum, gold, iron, nickel and silver. All of these materials have low yield strength and have demonstrated capability of absorbing high stresses from the pin joint.

To prevent the cushion layer 24 from reacting with the gold-tin braze alloy 26 (FIG. 1) used for joining pins 16, a reaction barrier layer 28 of titanium or zirconium is deposited over cushion layer 24. The thickness of the barrier layer 28 can range from approximately 2,000–10,000 angstroms, depending on its reaction rate with the braze alloy. In the preferred embodiment, the reaction barrier layer 28 is approximately 5,000 bangstroms thick. The use of higher volumes of Au-Sn braze at higher temperatures for a prolonged time would necessitate a thicker reaction barrier layer 28. Other reaction barrier layer candidates include cobalt or nickel, although they would require a greater thickness, in the range 15,000 to 30,000 angstroms in order to protect the cushion layer 24 from reacting with the braze.

Finally, a wettable surface layer 30 is next applied over the barrier layer 28 to enhance the wettability of the multilayer film for pin brazing. Gold, approximately 5,000 angstroms in thickness, is preferred although the thickness can vary from 2,000–20,000 angstroms.

Figure 3:
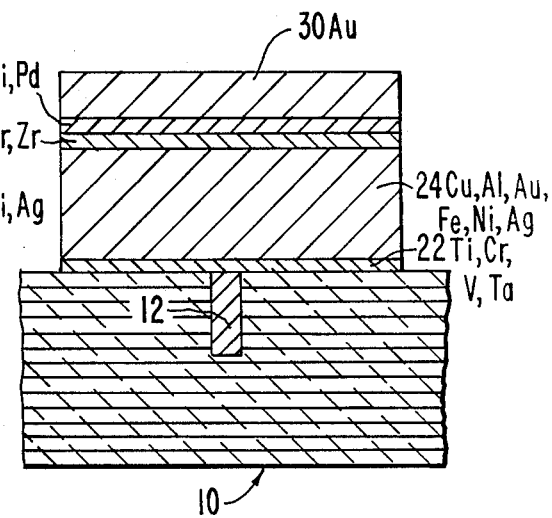
FIG. 3 is a cross-sectional view of a 5-layer thin film structure in accordance with the present invention.

Referring to FIG. 3, a thin layer of nickel or palladium 32, approximately 500–2,000 angstroms in thickness, may also be included between the reaction barrier layer 28 and wettable surface layer 30 for improved wettability.

Figure 4:
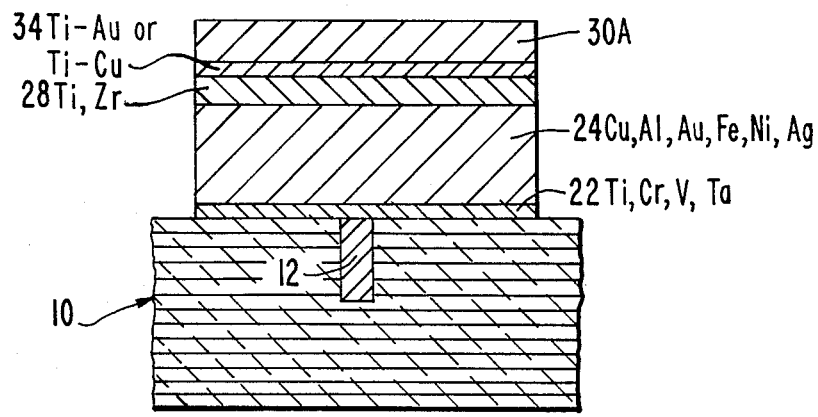
FIG. 4 is a cross-sectional view of a 4-layer thin film structure with a reaction barrier/wettable surface phased region.

In a modification to the multilayer structures previously described, after deposition of the reaction barrier layer 28, a thin layer 34, typically 1,000–5,000 angstroms, of Ti-Au or Ti-Cu phased region can be co-evaporated onto the pad, followed by a thin layer of gold 30 (FIG. 4). The compositions of Ti and Au or Cu can be controlled by simultaneously adjusting the deposition rates of the Ti and Au or Cu. With this blended structure, the phased layer 34 will maintain the slow reaction/dissolution rate with Au-Sn braze, and therefore will be capable of withstanding multiple chip reflow cycles without being completely reacted through. Furthermore, since Au or Cu is highly reactive with braze, blending them with Ti enhances the wettability of the reaction barrier layer. This is especially beneficial to the pin repair operation since evidence has shown that repaired pins can wet more easily on pads which already have been reflowed repeatedly prior to the repair operation.

While the invention has been particularly shown and described with reference to a preferred embodiment thereof, it will be understood by those skilled in the art that various changes in detail may be made therein without departing from the spirit, scope and teaching of the invention. Accordingly, the structure and process herein disclosed is to be considered merely as illustrative, and the invention is to be limited only as specified in the claims.

We claim:

1. A multilayer metal structure for joining input/output pins to a glass ceramic substrate comprising the following layers in the following order:
   an adhesion layer deposited on the glass ceramic substrate;
   a stress reducing layer deposited over said adhesion layer, said stress reducing layer comprising a soft metallic layer having a thickness in the range 1-20 microns;
   a barrier layer selected from the group consisting of zirconium and titanium deposited over said stress reducing layer; an
   a wettable surface layer for connecting to the input-/output pins;
   whereby the multilayer metal structure improves the integrity of the pin/glass ceramic substrate connection.

2. The multilayer metal structure as claimed in claim 1 wherein said adhesion layer is selected from the group consisting of titanium, vanadium, chromium or tantalum.

3. The multilayer metal structure as claimed in claim 1 wherein said stress reducing layer is selected from the group consisting of copper, iron, aluminum, silver, nickel, and gold.

4. The multilayer metal structure as claimed in claim 1 further including a layer of nickel between said barrier layer and said wettable surface layer.

5. The multilayer metal structure as claimed in claim 1 further including a layer of palladium between said barrier layer and said wettable surface layer.

6. The multilayer metal structure as claimed in claim 1 wherein said wettable surface layer is gold.

7. The multilayer metal structure as claimed in claim 3 further comprising a phased region between the reaction barrier layer and the wettable surface layer comprised of a mixture of the reaction barrier layer and wettable surface layer.

* * * * *